United States Patent
Sbiaa et al.

(10) Patent No.: US 7,522,389 B2
(45) Date of Patent: Apr. 21, 2009

(54) MAGNETORESISTANCE EFFECT ELEMENT COMPRISING A NANO-CONTACT PORTION NOT MORE THAN A FERMI LENGTH, METHOD OF MANUFACTURING SAME AND MAGNETIC HEAD UTILIZING SAME

(75) Inventors: Rachid Sbiaa, Tokyo (JP); Isamu Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/882,315

(22) Filed: Jul. 2, 2004

(65) Prior Publication Data

US 2005/0068688 A1 Mar. 31, 2005

(30) Foreign Application Priority Data

Sep. 30, 2003 (JP) .......................... P2003-342455

(51) Int. Cl.
*G11B 5/39* (2006.01)
(52) U.S. Cl. ................... 360/324.1; 360/324.12
(58) Field of Classification Search ............ 360/324.1, 360/324.12, 324.11, 324.2
See application file for complete search history.

(56) References Cited

U.S. PATENT DOCUMENTS

| | | | | |
|---|---|---|---|---|
| 5,715,121 A | * | 2/1998 | Sakakima et al. | 360/324.2 |
| 5,936,402 A | * | 8/1999 | Schep et al. | 324/252 |
| 6,046,891 A | * | 4/2000 | Yoda et al. | 360/324.1 |
| 6,052,262 A | * | 4/2000 | Kamiguchi et al. | 360/324.12 |
| 6,077,618 A | * | 6/2000 | Sakakima et al. | 428/693 |
| 6,452,764 B1 | * | 9/2002 | Abraham et al. | 360/324.2 |
| 6,590,750 B2 | * | 7/2003 | Abraham et al. | 360/324.2 |
| 6,731,475 B2 | * | 5/2004 | Ikeda | 360/322 |
| 6,751,073 B2 | * | 6/2004 | Hasegawa | 360/324.2 |
| 6,804,090 B2 | * | 10/2004 | Kokado | 360/324.2 |
| 6,806,804 B2 | * | 10/2004 | Saito et al. | 336/200 |
| 6,937,447 B2 | * | 8/2005 | Okuno et al. | 360/324.1 |
| 6,940,748 B2 | * | 9/2005 | Nejad et al. | 365/171 |
| 7,035,062 B1 | * | 4/2006 | Mao et al. | 360/324.2 |
| 2003/0104249 A1 | | 6/2003 | Okuno et al. | 428/693 |

(Continued)

FOREIGN PATENT DOCUMENTS

JP     11-510911     9/1999

(Continued)

OTHER PUBLICATIONS

N. Garcia, et al., Magnetoresistance In Excess Of 200% In Ballistic Ni Nanocontacts At Room Temperature And 100 Oe, Physical Review Letters, Apr. 5, 1999, 2923-2926, vol. 82, No. 14, © 1999 The American Physical Society.

(Continued)

*Primary Examiner*—Jefferson Evans
(74) *Attorney, Agent, or Firm*—Kenyon & Kenyon LLP

(57) ABSTRACT

A magnetoresistance effect element is composed of a first ferromagnetic layer, a second ferromagnetic layer, and at least one nano-contact portion formed between the first and second ferromagnetic layers, which are formed on the same plane on a substrate. The nano-contact portion has a maximum dimension of not more than Fermi length of a material constituting the nano-contact portion. A permanent magnet layer or in-stack bias layer may be further formed on the first and/or second ferromagnetic layer.

48 Claims, 7 Drawing Sheets

U.S. PATENT DOCUMENTS

2004/0201929 A1* 10/2004 Hashimoto et al. ....... 360/324.1

FOREIGN PATENT DOCUMENTS

JP  2003-204095  7/2003

OTHER PUBLICATIONS

N. Garcia, et al., Ballistic Magnetoresistance In Nanocontacts Electrochemically Grown Between Macro- and Microscopic Ferromagnetic Electrodes, Applied Physics Letters, Mar. 11, 2002, 1785-1787, vol. 80, No. 10, © American Institute of Physics.

* cited by examiner

MAGNETORESISTANCE EFFECT ELEMENT COMPRISING A NANO-CONTACT PORTION NOT MORE THAN A FERMI LENGTH, METHOD OF MANUFACTURING SAME AND MAGNETIC HEAD UTILIZING SAME

BACKGROUND OF THE INVENTION

1. Field of the Invention

The present invention relates to a magnetoresistance (or magneto-resistance) effect element particularly provided with Ballistic Magneto Resistance (BMR) effect, to a method of manufacturing such magnetoresistance effect element and to a magnetic head provided with such magnetoresistance effect element.

2. Relevant Art

Generally, a giant magnetoresistance effect (GMR effect) is a phenomenon indicating rate of change in magnetoresistance (called herein magnetoresistance ratio) which is developed or reviled in a case that electric current passes in a plane of a lamination structure of ferromagnetic layer/non-magnetic layer/ferromagnetic layer. Moreover, the magnetoresistance effect element of such GMR has been further actively studied for the development of more large magneto-resistance change rate, and up to now, ferromagnetic tunnel junction and a CPP (Current Perpendicular to Plane)-type MR element, in which the current passes perpendicularly with respect to the lamination structure, have been developed, and hence, has high degree of expectation for reproducing (regenerative) element for magnetic sensor, magnetic recording element and the like.

In the field of the magnetic recording technology, according to improvement of recording density, it has been necessarily progressed to make compact recording bits, and as its result, it becomes difficult to obtain a sufficient signal strength. Thus, taking such matters into consideration, it has been desired for engineers in this field to search a material having high sensitive magnetoresistance effect and develop or revile an element indicating a large magnetoresistance ratio.

Recently, there have been reported, as material indicating magnetoresistance effect of more than 100%, "magnetic micro contact" which is formed by butting two needle-like nickel (Ni) as shown, for example, in a document of "Physical Review Letters, vol. 82, p 2923 (1999), by N. Garcia, M. Munoz, and Y. W. Zhao" (Document 1). This magnetic micro contact is manufactured by butting two ferromagnetic materials worked in form of needle or in form of triangle. More recently, there has been developed a magnetic micro contact in which two fine Ni wires are arranged in T-shape and micro column is grown at a contact portion of these wires by electro-deposition method (for example, refer to a document of "Appl. Phys. Lett. Vol. 80, p 1785 (2002), by N. Garcia, G. G. Qian, and I. G. Sveliev" (Document 2).

It is considered that an extremely high MR (Magneto Resistance) ratio developing such element is based on spin transport of a magnetic area existing in the magnetic micro contact formed between two ferromagnetic layers having magnetized directions in anti-parallel to each other. It is considered that, in the magnetoresistance effect element utilizing the magnetic micro contact having such characteristics, since electrons pass without receiving any scattering or diffusion (i.e., pass ballistically), such magnetoresistance effect element is called BMR element (Ballistic Magneto Resistance element).

In addition, more recently, there has also been reported a magnetoresistance effect element having such magnetic micro contact. For example, in Japanese Patent Laid-open (KOKAI) Publication No. 2003-204095 (Document 3), there is reported a magnetoresistance effect element composed of first ferromagnetic layer/insulating layer/second ferromagnetic layer, in which the first ferromagnetic layer is connected to the second ferromagnetic layer at a predetermined portion of the insulating layer, the magnetoresistance effect element being provided with a hole having an opening having the maximum diameter of less than 20 nm. Furthermore, in Japanese Patent Application National Publication (Laid-open) No. HEI 11-510911 (Document 4), there is reported a magneto-resistance effect element composed of two magnetic layers connected to each other through a narrow segment having a width of about 100 nm.

However, in consideration of application of a BMR element to a magnetic head, a dimension of a free layer sensitive to magnetic field leaking from a surface of a medium is made small such as, for example, to several tens nanometers. For example, in a case of recording density of 1 Tbits/in2, such dimension is of 40 to 50 nm, and in a case of a BMR element capable of realizing an extremely high MR ratio, a structure of a magnetic domain of the magnetic micro contact (called hereinlater "nano-contact portion") is a "key" of the BMR effect. As the miniaturization progresses, strong demagnetizing magnetic field is generated from the end face of the thin free layer, which results in that any magnetic stability is hardly obtainable and thermal stability is extremely lowered, being inconvenient and disadvantageous.

Therefore, in the BMR element, it is an extremely important object to provide a practically usable BMR element capable of ensuring the magnetic domain control and magnetic stability thereof and also provide a manufacturing method of such BMR element.

SUMMARY OF THE INVENTION

An object of the present invention is to substantially eliminate defects or drawbacks encountered in the prior art mentioned above and to provide a magnetoresistance effect element, particularly for a magnetic head, having BMR effect capable of achieving improved stability and sensitivity of a free layer and a magnetic domain of a nano-contact portion constituting the magnetoresistance effect element.

Another object of the present invention is to provide a method of manufacturing such magnetoresistance effect element in a suitable and improved manner.

A further object of the present invention is to also provide a magnetic head provided with such magnetoresistance effect element which is manufactured by the method of the present invention.

These and other objects can be achieved according to the present invention by providing, in one aspect, a magneto-resistance effect element comprising:

a first ferromagnetic layer;

a second ferromagnetic layer; and at least one nano-contact portion formed between the first and second ferromagnetic layers on a same plane, wherein the nano-contact portion has a maximum dimension of not more than Fermi length of a material constituting the nano-contact portion.

According to the invention of this aspect, since the nano-contact portion has a maximum dimension of not more than Fermi length of a material constituting the nano-contact portion, the signal detection can be performed at high sensitivity due to the BMR effect, and the magnetic domain control and the magnetic stability can be ensured by the function of reducing the magnetostatic energy and the function of suppressing the generation of the magnetostatic charge at the end surface of the layer structure.

In preferred embodiments or examples in this aspect, the maximum dimension includes a length in a width direction of the nano-contact portion normal to the location of the first and second ferromagnetic layers on the same plane and a length in a direction perpendicular to the width direction.

The first and second ferromagnetic layers and the nano-contact portion may be preferably formed of the same material having a spin polarization of not less than 0.5. The first and second ferromagnetic layers and the nano-contact portion may be each formed of a material selected from the groups consisting of a ferromagnetic metal group of Co, Fe, Ni, CoFe, NiFe, CoFeNi; a ferromagnetic metalloid group of $CrO_2$; and a ferromagnetic oxide group of $Fe_3O_4$.

It is preferred that the first ferromagnetic layer is formed at a predetermined contracting angle of $\theta_1$ towards the nano-contact portion and the second ferromagnetic layer is also formed at a predetermined contracting angle of $\theta_2$ towards the nano-contact portion 12, the contracting angles each being in a range of 10 to 90 degrees selected so as to make maximum or substantially maximum a magnetic resistance ratio of an obtained magnetoresistance effect element. The first ferromagnetic layer forms a free layer and the second ferromagnetic layer forms a pinned layer having a direction of magnetization which is fixed in a direction apart from the nano-contact portion.

The magnetoresistance effect element may further comprise permanent magnet layers disposed on both side portions of the first ferromagnetic layer so as to control the magnetization direction of the first ferromagnetic layer. The permanent magnets may be each formed of a material of CoPt, CoPtRh, CoPtB or CoCrCPt.

The magnetoresistance effect element may further comprise an in-stack bias layer disposed on the first ferromagnetic layer so as to control the magnetization direction of the first ferromagnetic layer. The in-stack bias layer may be composed of a non-magnetic layer, a ferromagnetic layer and an anti-ferromagnetic layer disposed on the first ferromagnetic layer in this order.

The magnetoresistance effect element may further comprise permanent magnet layers disposed on both side portions of the second ferromagnetic layer so as to fix the magnetization direction of the second ferromagnetic layer. The permanent magnets are each formed of a material of CoPt, CoPtRh, CoPtB or CoCrCPt.

The magnetoresistance effect element may further comprise an in-stack bias layer disposed on the second ferromagnetic layer so as to control the magnetization direction of the second ferromagnetic layer. The in-stack bias layer may be composed of a non-magnetic layer, a ferromagnetic layer and an anti-ferromagnetic layer disposed on the second ferromagnetic layer in this order.

According to these preferred embodiments of this aspect, first and the second ferromagnetic layers are formed at predetermined contracting angles of $\theta_1$ and $\theta_2$ towards the nano-contact portion 12 so as to make maximum or substantially maximum a magnetic resistance change rate of an obtained magnetoresistance effect element, the signal detection can be more sensitively performed.

The formation of the permanent magnet layers or in-stack layer can contribute the strengthening of the pinning degree of magnetization of the second ferromagnetic layer as the pinned layer, so that this arrangement is advantageous for increasing the magnetic resistance effect at the time of less contribution of the anisotropy of shape, and moreover, the pinned layer has the magnetization direction normal to the medium at a portion apart therefrom, so that it is less affected by the magnetic field generated from the magnetization transition area of the medium and the reproduction operation can be hence stably maintained.

On the other hand, in the first ferromagnetic layer formed as the free layer, the magnetization is rotated or inverted in sensitively response to the magnetic field generated from the magnetization transition area of the medium, the direction of its easy axis is made parallel to the medium, and moreover, this direction may be made perpendicular to the medium to be parallel to the magnetization direction of the pinned layer.

In another aspect of the present invention, the afore-mentioned objects can be achieved by providing a method of manufacturing a magnetoresistance effect element comprising the steps of:

preparing a substrate;

forming a first ferromagnetic layer and a second ferromagnetic layer both on the substrate; and patterning the ferromagnetic layers so as to from a nano-contact portion therebetween so that the nano-contact portion has a maximum dimension of not more than Fermi length of a material forming the nano-contact portion.

According to the invention of this aspect, the magnetoresistance effect element of the characters and structures mentioned above can be effectively and easily manufactured by forming the ferromagnetic layers on the substrate and then patterning the layers in the predetermined manner. Therefore, according to this method, the magnetoresistance effect element can be manufactured with high stable and good yield.

In a preferred embodiment of this aspect, the patterning step is performed such that the first ferromagnetic layer is formed at a predetermined contracting angle of $\theta_1$ towards the nano-contact portion and the second ferromagnetic layer is also formed at a predetermined contracting angle of $\theta_2$ towards the nano-contact portion 12, the contracting angles each being in a range of 10 to 90 degrees selected so as to make maximum or substantially maximum a magnetic resistance change rate of an obtained magnetoresistance effect element.

It may be preferred that the second ferromagnetic layer forms a pinned layer having a direction of magnetization which is fixed in a direction apart from the nano-contact portion, and the method may further comprise the step of forming permanent magnet layers, having the same direction of magnetization as that of the magnetization of the second ferromagnetic layer, so as to sandwich the nano-contact portion therebetween on the same plane.

The second ferromagnetic layer forms a pinned layer having a direction of magnetization which is fixed in a direction apart from the nano-contact portion, and the method may further comprise the step of forming an in-stack bias layer on the second ferromagnetic layer. The in-stack bias layer may be composed of a non-magnetic layer, a ferromagnetic layer and an anti-ferromagnetic layer formed on the second ferromagnetic layer in this order.

The ferromagnetic layer of the in-stack bias layer is formed of the same material as that of the second ferromagnetic layer or a material different from that of the second ferromagnetic layer.

It may be preferred that the first ferromagnetic layer forms a free layer, and the method may further comprise the step of forming permanent magnet layers, for making the first ferromagnetic layer as single domain, so as to sandwich the nano-contact portion therebetween on a same plane. The first ferromagnetic layer forms a free layer, and the method may further comprise the step of forming an in-stack bias layer on the first ferromagnetic layer. The in-stack bias layer may be composed of a non-magnetic layer, a ferromagnetic layer and an anti-ferromagnetic layer formed on the second ferromagnetic layer in this order.

It may be preferred that the ferromagnetic layer of the in-stack bias layer is formed of the same material as that of the first ferromagnetic layer or a material different from that of the first ferromagnetic layer.

According to the above preferred embodiment of this aspect, in addition to the various advantageous effects and functions obtained by the producing of the magnetoresistance effect element mentioned above, the first and second contracting angles in the patterning step can be easily adjusted.

In a further aspect of the present invention, the aforementioned objects can be achieved by providing a magnetic head comprising:

a magnetoresistance effect element;

external electrodes disposed on both sides of the magnetoresistance effect element; and a pair of shield members disposed on both sides of the external electrodes, the magnetoresistance effect element comprising: a first ferromagnetic layer; a second ferromagnetic layer; and at least one nano-contact portion formed between the first and second ferromagnetic layers on the same plane, wherein the nano-contact portion has a maximum dimension of not more than Fermi length of a material constituting the nano-contact portion.

According to the invention of this aspect, a magnetic head excellent in stability and having high performance can be produced by utilizing the magnetoresistance effect element mentioned above which is manufactured by the effective method also mentioned above.

Further, it is to be noted that the nature and further characteristic features of the present invention will be made more clear from the following descriptions made with reference to the accompanying drawings.

BRIEF DESCRIPTION OF THE DRAWINGS

In the accompanying drawings:

FIG. 7, including

DESCRIPTION OF THE PREFERRED EMBODIMENTS

Preferred embodiments of a magnetoresistance effect element, a method of manufacturing the same and a magnetic head utilizing it according to the present invention will be described hereunder with reference to the accompanying drawings.

Figure 1:
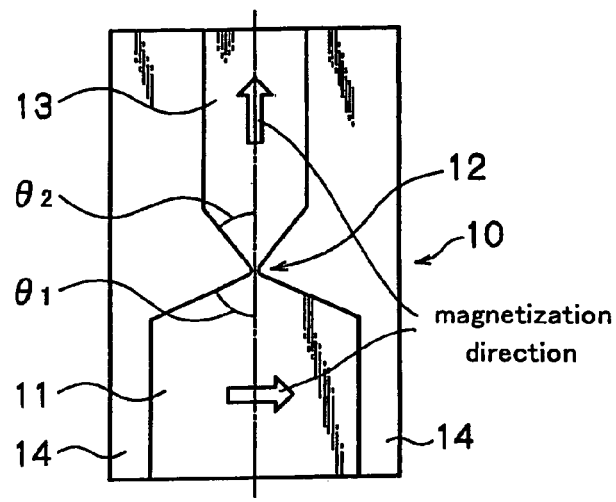
FIG. 1 is an illustrated plan view showing one example of a magnetoresistance effect element according to one embodiment of the present invention.

One embodiment of a magnetoresistance effect element according to the present invention is first described hereunder with reference to FIG. 1.

Figure 8:
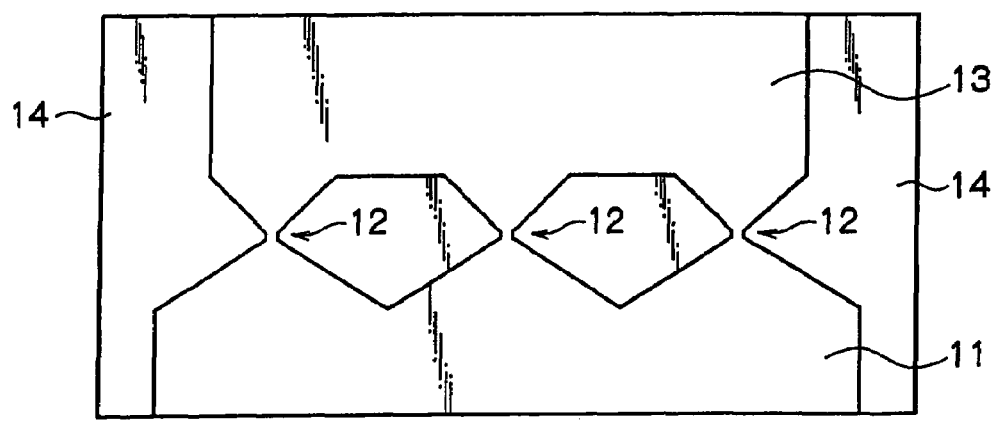
FIG. 8 is an illustration showing an example in which three nano-contact portions are formed on the same plane.

In this embodiment, the magnetoresistance effect element 10 is composed of two ferromagnetic layers 11 and 13 and a nano-contact portion 12 formed between these two ferromagnetic layers 11 and 13, all of which are formed in the same plane in a plan view. That is, the magnetoresistance effect element 10 of this embodiment is provided with two ferromagnetic layers 11 and 13 disposed on a substrate 14 so as to sandwich the nano-contact portion 12 therebetween in substantially a symmetric arrangement. In other words, the fine nano-contact portion 12 is formed so as to connect the two ferromagnetic layers 11 and 13 on the substrate. Further, in the illustrated embodiment, although only one nano-contact portion 12 is formed, a plurality of nano-contact portions 12 may be formed as shown in FIG. 8.

The nano-contact portion 12 and the respective ferromagnetic layers 11 and 13 constituting the magneto-resistance effect element of the present invention will be described hereunder, respectively.

[Nano-Contact Portion]

The nano-contact portion 12 is formed of a ferromagnetic material having a spin polarization of not less than 0.5, and although various kinds of ferromagnetic materials may be utilized, it is desirable to select the material from the following groups of ferromagnetic metal group: Co; Fe; Ni; CoFe; NiFe; CoFeNi; ferromagnetic metalloid group: $CrO_2$; ferromagnetic oxide group: $Fe_3O_4$; and so on, in which CoFe or NiFe will be selected as more preferable ferromagnetic material.

Figure 2:
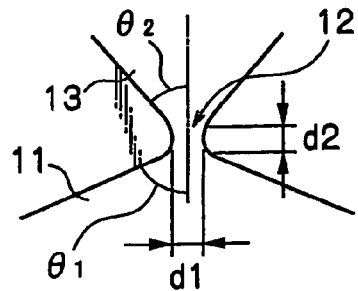
FIG. 2 is an illustration, in an enlarged scale, of a nano-contact portion of the magnetoresistance effect element of FIG. 1.

FIG. 2 is an enlarged view showing such nano-contact portion 12, constituting the magnetoresistance effect element of the present invention, having a dimension (length) of not more than Fermi length.

The nano-contact portion 12 is formed so as to have a shape of circle, elliptical, rectangular (triangle, square or so) or like supposing that the magnetoresistance effect element, be viewed in a front-side plan view. In this meaning, the dimension, i.e., length, d1 in the width direction of the nano-contact portion 12 will be considered to be equal to the maximum length d1 in the plane in which the nano-contact portion 12 exists, and accordingly, in the present invention, it will be said that the maximum length d1 of the nano-contact portion 12 is less than (not more than) the Fermi length. Further, it is also desirable that a length (distance) d2 of the nano-contact portion 12 in the vertical direction, normal to the width direction, as viewed in the plane of FIG. 2 is also less than the Fermi length similar to the length d1.

The dimension d1 of the nano-contact portion 12 in the width direction is less than the Fermi length which is value specific to material (specific value or characteristic value), which is different for each material constituting the ferromagnetic material forming the nano-contact portion 12. However, many kinds of such ferromagnetic materials have the Fermi length of about 60 nm to 100 nm, so that the words "less than the Fermi length" will be prescribed as "less than 100 nm" or "less than 60 nm". In fact, Ni has the Fermi length of about 60 nm and that of Co is of about 100 nm.

Furthermore, it is more desirable that the maximum length d1 of the nano-contact portion 12 in its width direction is less than a mean free path. Although the value of this mean free path is also a value specific to ferromagnetic materials constituting the nano-contact portions, many of them reside in a range of about 5 nm to 15 nm. Accordingly, in this meaning, the word "less than mean free path" will be prescribed substantially equivalently as "less than 15 nm" or "less than 5 nm". In concrete examples, NiFe has a mean free path of about 5 nm and that of Co is of about 12 nm.

Incidentally, as mentioned above, it is also desirable that a length (distance) d2 of the nano-contact portion 12 in vertical direction as viewed in the plane of FIG. 2 is also less than the Fermi length as like as the length d1. More specifically, it is desired to be prescribed as being less than 100 nm or less than 60 nm, and moreover, it is further desirable for the length d2 to be prescribed to be less than the mean free path, i.e., less than 15 nm or less than 5 nm as mentioned above.

On the contrary, in a case that the lengths d1 and d2 in the width and lamination directions of the nano-contact portion 28 exceed the Fermi length, the thickness of the magnetic wall of the nano-contact portion 12 becomes large in the case that the magnetization shows an anti-parallel state, and hence, it becomes difficult for electrons passing the nano-contact portion 28 to keep their spin direction. As a result, in this meaning too, it may be difficult to attain the magnetoresistance effect based on the change in the direction of the magnetization. Accordingly, it is desirable for the preferred embodiment of the present invention that the dimension of the nano-contact portion 12 (d1 and d2) is less than the Fermi length, and especially, in the viewpoint of well keeping the spin information, it is desired to be less than the mean free path.

Further, on the other hand, in the case where the lengths d1 and d2 in the width and lamination directions of the nano-contact portion 12 are less than the Fermi length, a thin wall section is generated to the magnetic wall section of the nano-contact portion 12. Accordingly, relative relationship in magnetization arrangement between the two ferromagnetic layers 11 and 13, between which the nano-contact portion 12 is disposed, varies, and hence, electric resistance between these ferromagnetic layers 11 and 13 will also vary.

In the case of the magnetoresistance effect element 10 of the present invention, since, basically, there exists a magnetic field area, in which the electrical resistance is reduced in accordance with the magnetic field even if magnetic field applying direction be changed, it will be said that the magnetoresistance effect produced there is the effect which is produced by the magnetic wall formed to the nano-contact portion 12. Herein, the magnetic wall of the nano-contact portion 12 acts as a transition region or area of two portions (i.e., two ferromagnetic layers 11 and 13 with the nano-contact portion 12 being sandwiched therebetween) having different magnetized directions. Further, according to the present invention, the magneto-resistance effect more than 50% will be produced in accordance with the magnetized direction and magnitude of the applied magnetic field.

That is, in the magnetoresistance effect element 10 of this embodiment, since the nano-contact portion 12, which is disposed between the two ferromagnetic layers 11 and 13 on the same plane, has the maximum dimension (d1: width direction and d2; layer lamination direction, i.e., vertical direction normal to the width direction), which is not more than the Fermi length, the signal detection with high sensitivity can be performed by the BMR effect.

Such nano-contact portion 12 can be formed with high performance by a fine working means such as nano-lithograph micro fabrication technology. Furthermore, since the magnetoresistance effect element, of the present invention, provided with such nano-contact portion 12 indicates a large rate of change in magnetoresistance (called magneto-resistance ratio), it is considered that electrons can ballistically pass through the nano-contact portion 12 without any scattering. Further, the magnetoresistance ratio mentioned above means an MR ratio ($\Delta R/R$), which is defined by an electrical resistance R at a time of sufficiently large magnetic strength and an electrical resistance change $\Delta R$ at a time when an applied magnetic field is changed. In other words, R is the minimum resistance and $\Delta R$ is the resistance change.

[Ferromagnetic Layers]

The two ferromagnetic layers formed so as to sandwich the nano-contact portion 12 of the characters mentioned above are composed of the first ferromagnetic layer 11 having a first contracting (reduction) angle $\theta_1$ on the side of the nano-contact portion 12 and the second ferromagnetic layer 13 having a second contracting (reduction) angle $\theta_2$ on the side of the nano-contact portion 12.

The first ferromagnetic layer 11 forms a free layer having a magnetization direction normal to a direction extending apart from the nano-contact portion 12, which is also normal to a magnetization direction of the second ferromagnetic layer 13 forming a pinned layer mentioned hereinlater.

[First Ferromagnetic Layer]

The free layer as the first ferromagnetic layer 11 is a layer having a function in which the magnetization is rotated or inverted in sensitive response to a magnetic field generated from a magnetic media flux. In a preferred embodiment of the present invention, it is desirable to dispose a permanent magnet layer or in-stack bias layer between the substrate 14 and the first ferromagnetic layer 11 or on the first ferromagnetic layer 11 to thereby keep the magnetization direction of the easy axis parallel to the medium. According to this arrangement, in the free layer in which the magnetizing direction is rotated or inverted in sensitive response to the magnetic field generated from the magnetization transition area of the medium in the longitudinal recording case or from the recorded bit in the perpendicular recording case, the direction of the easy axis can be made parallel to the medium. Further, it may be possible to make the direction of the easy axis parallel to the magnetization direction of the second ferromagnetic layer 13 constituting the pinned layer by making the direction of easy axis of the free layer vertical with respect to the medium.

Figure 3:
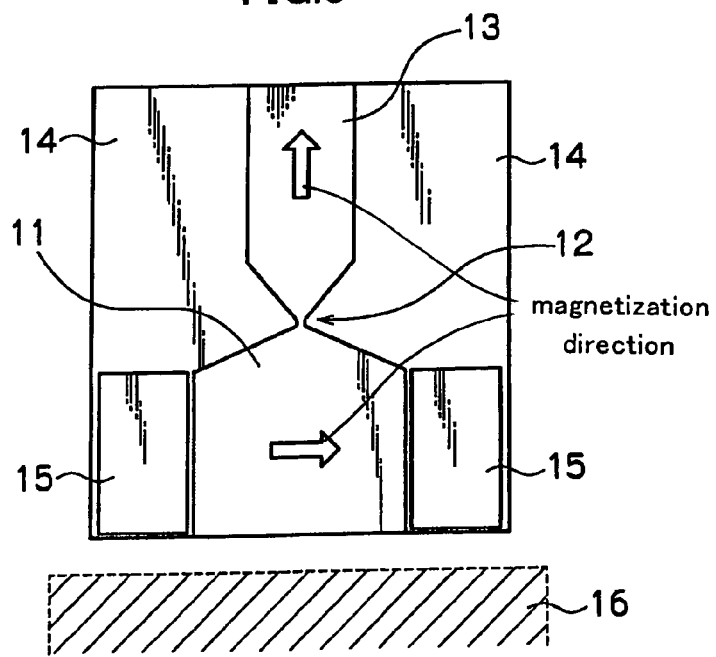
FIG. 3 is an illustrated plan view showing one example of a magnetoresistance effect element provided with a permanent electrode layer according to one embodiment of the present invention.

The permanent magnet layer 15 acts to constitute the first ferromagnetic layer 11 forming the free layer as single domain, and for example, as shown in FIG. 3, the permanent magnet layers 15 are disposed on the substrate 14 in a manner such that the first ferromagnetic layer 11 is sandwiched from the lateral right and left directions (as viewed in FIG. 3) so that the magnetization direction of the first ferromagnetic layer 11 becomes parallel to the medium 16. In such arrangement, it is desired to locate the permanent magnet layers 15 and the first ferromagnetic layer 11 on the same plane. Further, the permanent magnet layer 15 is formed of a material such as CoPt, CoPtRh, CoPtB, CoCrBPt or like so as to provide, in usual, a thickness of 2 to 20 nm.

Figure 4A:
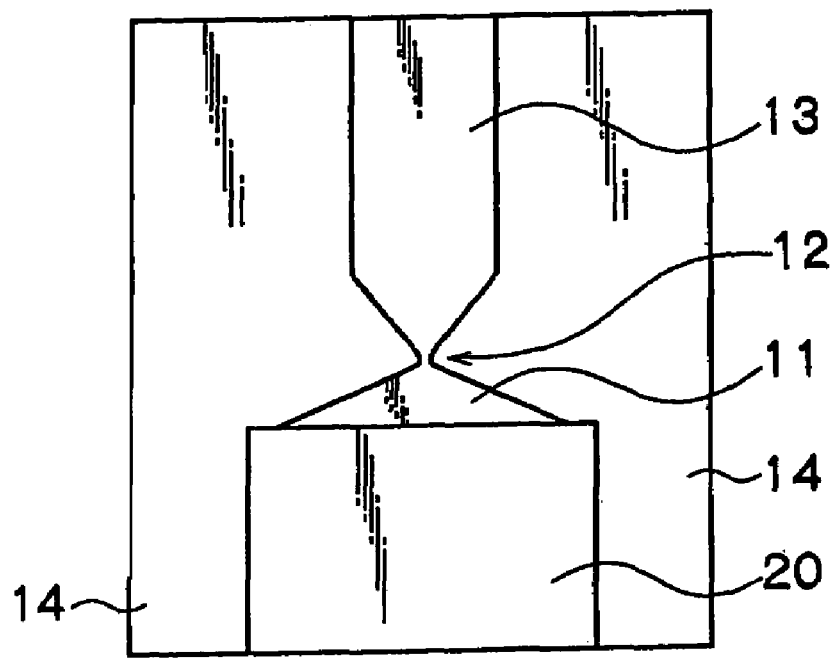
FIG. 4A is a plan view showing one example of a magnetoresistance effect element provided with an in-stack bias layer according to one embodiment of the present invention.
Figure 4B:
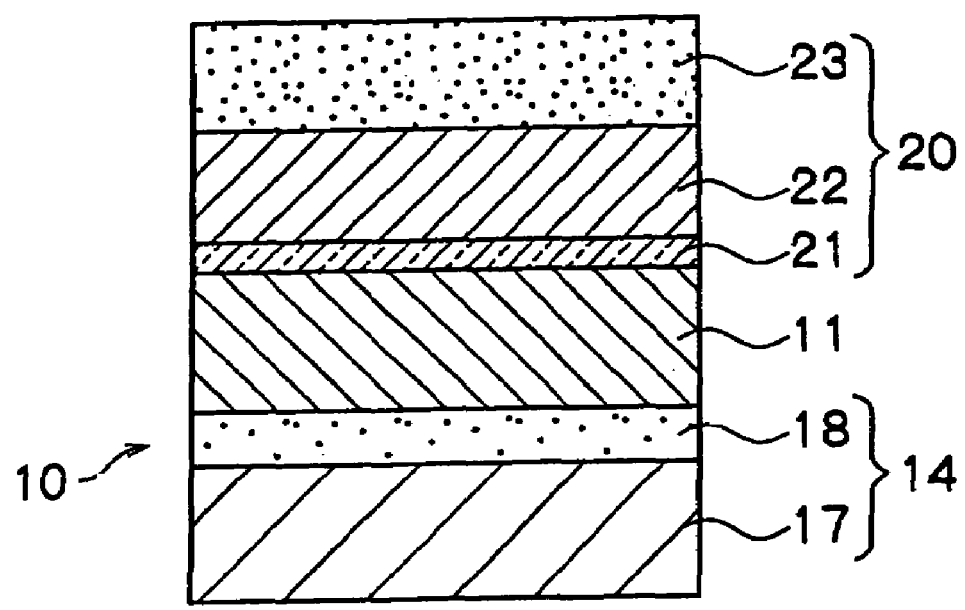
FIG. 4B is a sectional view thereof in a layer lamination direction.

On the other hand, the in-stack bias multilayer 20 is utilizing the magnetostatic coupling between the layer 22 and layer 11. The magnetization direction of layer 22 is fixed by exchange coupling to an anti-ferromagnetic layer 23, and for example, as shown in FIG. 4 (FIGS. 4A and 4B), the in-stack bias multilayer 20 is composed of a non-magnetic layer 21, a ferromagnetic layer 22 and the anti-ferromagnetic layer 23 laminated in this order on the first ferromagnetic layer 11.

In this layer lamination structure of the in-stack bias multilayer 20, the non-magnetic layer 21 acts to adjust the degree of coupling between the first ferromagnetic layer 11 as a base layer and the ferromagnetic layer 22 as a cover layer. This non-magnetic layer 21 may be preferably formed of a material such as Ta or Cu so as to have a thickness of 0.5 to 3 nm.

The ferromagnetic layer 22 formed on the non-magnetic layer 21 is a layer acting to stabilize the first ferromagnetic layer 11 as the free layer, and for example, it is desirable for the ferromagnetic layer 22 to be formed of a ferromagnetic material, and so on so as to have a thickness of 2 to 10 nm, in usual. Although the ferromagnetic material to be selected for the ferromagnetic layer 22 is the same material as that constituting the first ferromagnetic material 11 or is a material different therefrom, it is desired to be formed of the same material for the purpose of easy manufacturing.

The anti-ferromagnetic layer 23 formed on the ferromagnetic layer 22 is a layer acting to fix the magnetization of the ferromagnetic layer 22 through exchange coupling, and for example, is formed preferably of a material such as PtMn, IrMn, NiO, FeMn, PtPd or like so as to have a thickness of, in usual, 2 to 20 nm. The formation of such layer 22 can induce an external field on the layer 11 and makes it single magnetic domain, thus avoiding noise during readout operation. Further, as shown in FIG. 4, the magnetoresistance effect element 10 of the present invention is formed on the substrate 14 which is composed of a base substrate 17 and a buffer layer 18 formed thereon. As such a base substrate 17, there may be utilized a Si substrate, a Si oxide substrate, an AlTiC substrate or like. The buffer layer 18 is a layer disposed for enhancing crystalline characteristic of the ferromagnetic material constituting the two ferromagnetic layers 11 and 13 and is composed of, for example, a Ta layer, a NiCr layer, a Cu layer or like. The ferromagnetic material forming the two ferromagnetic layers 11 and 13 is applied to form a film on the buffer layer 18 through the sputtering treatment or ion beam deposition treatment so as to have a thickness of several nanometers or several tens nanometers.

[Second Ferromagnetic Layer]

The second ferromagnetic layer 13 is a pinned layer fixed in the direction in which the magnetization direction is apart from the nano-contact portion 12, that is, the direction extending upward from a base point of the fine nano-contact portion 12 in the plan view of FIG. 1, which is normal to the magnetization direction in the first ferromagnetic layer 11.

In the present invention, it is desired that the magnetization direction of the second ferromagnetic layer 13 is fixed by the permanent magnet layer 15 or in-stack bias layer 20, whereby the pinning degree of the magnetization can be strengthened, being advantageous for enhancing the magnetic resistance effect in a case of expecting less contribution of magnetic shape anisotropy.

Figure 5A:
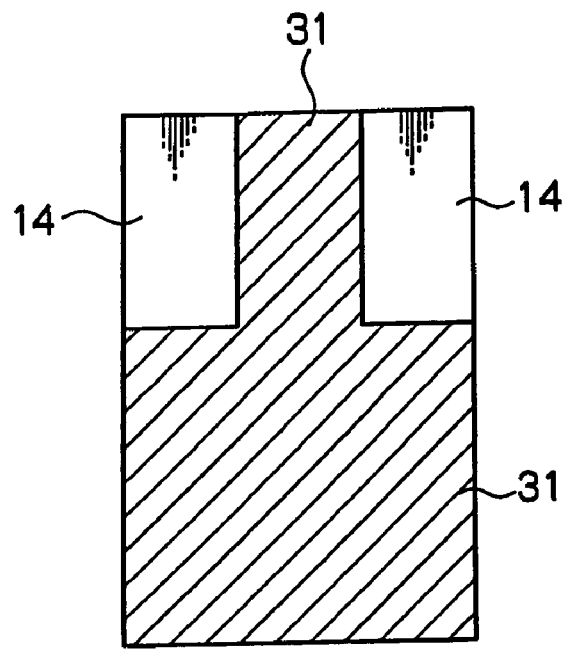
FIGS. 5A and 5B are sectional and plan views, respectively, for explanation of a permanent magnet layer forming step.
Figure 5B:
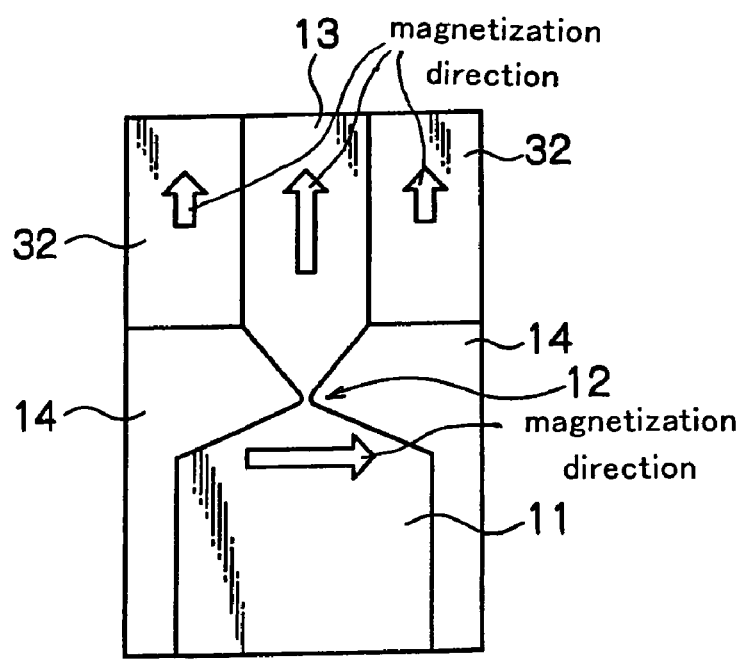

On the other hand, the fixing of a permanent magnet layer 32 is performed in the manner, as shown in FIG. 5B, that the permanent magnet layer 32 is disposed on the substrate 14 so as to sandwich the second ferromagnetic layer 13 from the bilateral right and left directions (as viewed in FIG. 2, for example) so that the magnetization direction of the second ferromagnetic layer 13 accords with the direction extending apart from the nano-contact portion 12.

Further, as mentioned above with reference to the permanent magnet layer 15, this permanent magnet layer 32 is also formed of a material such as CoPt, CoPtRh, CoPtB, CoCrBPt or like so as to provide, in usual, a thickness of 2 to 20 nm.

The permanent magnet layer 32 is formed, as shown in FIG. 5A, in a manner that a resist film 31 is first formed so that the surface of the substrate 14 is exposed for forming the permanent magnet layer 32 through the photolithography technology, the permanent magnet layer 32 is then formed on the entire surface of the resist film 32, and thereafter, the permanent magnet layer 32 formed on the resist film 31 is left off to remove the same.

The in-stack bias layer 20 is composed, as like as the first ferromagnetic layer 11, of a non-magnetic layer 21, a ferromagnetic layer 22 and the anti-ferromagnetic layer 23 laminated in this order on the second ferromagnetic layer 13.

In this layer lamination structure of the in-stack bias layer 20, the non-magnetic layer 21 acts to reduce the strength of exchange coupling layer 21 is a layer acting to stabilize the second ferromagnetic layer 13 as the pinned layer, and for example, it is desirable for the ferromagnetic layer 22 to be formed of a ferromagnetic material selected from the following, groups of a ferromagnetic metal group: Co; Fe; Ni; CoFe; NiFe; CoFeNi; and so on so as to have a thickness of, in usual, 2 to 10 nm. Although the ferromagnetic material to be selected for the ferromagnetic layer 22 is the same material as that constituting the second ferromagnetic material 13 or is a material different therefrom, it is desired to be formed of the same material for the purpose of easy and stable manufacturing.

The anti-ferromagnetic layer 23 formed on the ferromagnetic layer 22 is a layer acting to fix the magnetization of the ferromagnetic layer 22, and for example, is formed preferably of a material such as PtMn, IrMn, NiO, FeMn, PtPd or like so as to have a thickness of, in usual, 2 to 20 nm. The formation of such anti-ferromagnetic layer 23 can fix the magnetization direction of the second ferromagnetic layer 13 as the pinned layer.

Figure 6A:
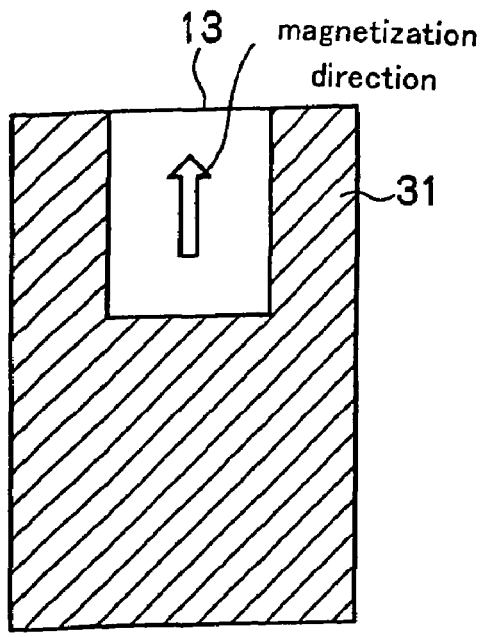
FIGS. 6A to 6C are views for explanation of an in-stack layer forming step.
Figure 6B:
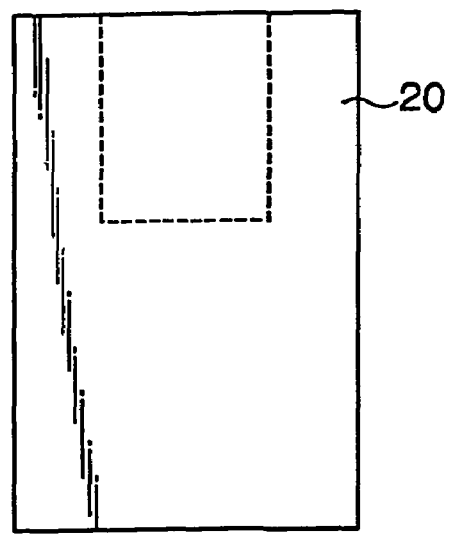
Figure 6C:
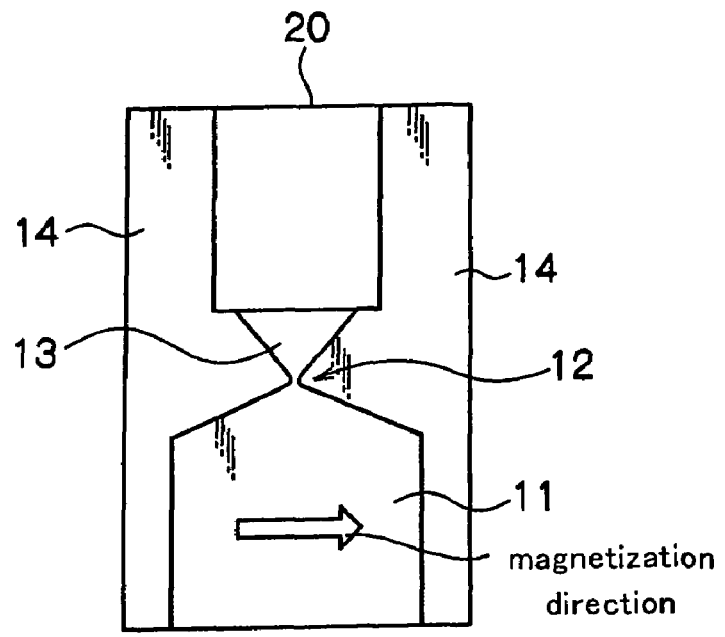

The fixing due to the in-stack bias layer 20 is performed in the manner that, as shown in FIGS. 6A to 6C, a resist film 31 is first formed so that the surface, to which the in-stack bias layer 20 is formed, is exposed through the photolithography technology, the non-magnetic layer 21, the ferromagnetic layer 22 and the anti-ferromagnetic layer 23 are laminated in this order on the entire surface of the resist film 31, and the respective layers formed on the surface of the resist film 31 are left off to remove them.

[Contracting Angle]

In the magnetoresistance effect element of the present invention, the first ferromagnetic layer 11 is formed at a predetermined contracting angle of $\theta_1$ towards the nano-contact portion 12 and the second ferromagnetic layer 13 is also formed at a predetermined contracting angle of $\theta_2$ towards the nano-contact portion 12. In such arrangement, it is desired that these contracting angles are each in a range of 10 to 90°. In this range, the most preferred value is selected so as to make maximum or substantially maximum the magnetic resistance change rate of the obtained magnetoresistance effect element.

Further, it is desired, for the contracting angle 01 of the first ferromagnetic layer 11 on the side of the nano-contact portion 12, to be 90° or near, for example, in a range of 75 to 90° for the purpose of suppressing the deterioration of the soft magnetic characteristic by inducing a magnetic shape anisotropy.

On the other hand, it is desired for the contracting angle $\theta_2$ of the second ferromagnetic layer 13 on the side of the nano-contact portion 12 to be set to be in a range of 10 to 60° in consideration of a large influence to the sensitivity of the nano-contact portion 12.

[Magnetoresistance Effect Element Manufacturing Method]

A method of manufacturing the magnetoresistance effect element of the present invention of the characters and structures mentioned above will be described hereunder, and the method generally comprises the steps of, as shown in FIG. 7, a ferromagnetic layer forming step for forming a layer composed of ferromagnetic layers on the substrate 14 and a patterning step for patterning the thus formed ferromagnetic layer so as to provide the nano-contact portion 12 between two ferromagnetic layers so as to have the maximum length (dimension) of not more than Fermi length of the ferromagnetic material used.

In the ferromagnetic layer forming step, a Si substrate, a Si oxide substrate, an AlTiC substrate or like substrate is utilized as the base substrate 17, and it is desired to form the buffer layer 18 on this base substrate 17 for the purpose of enhancing the crystalline characteristic of the ferromagnetic material forming the two ferromagnetic layers 11 and 13 such as of Ta layer, NiCr layer or Cu layer.

The magnetoresistance effect element manufacturing method will be described hereunder with reference to FIG. 7 (FIGS. 7A to 7D).

Figure 7A:
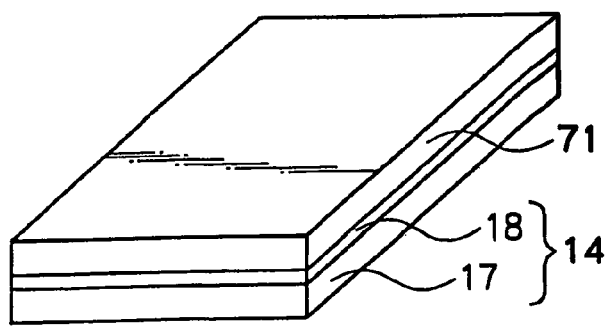
FIGS. 7A to 7D, shows steps of manufacturing a magnetoresistance effect element of FIG. 1 according to the present invention.

A layer 71 composed of the ferromagnetic layer is formed, as shown in FIG. 7A, on the substrate 14 on which the buffer layer 18 is formed through a sputtering deposition or ion beam deposition process so as to have a film thickness of several nanometers or several tens nanometers.

Thereafter, the thus formed ferromagnetic layer is subjected to a patterning treatment or process to thereby manufacture the magnetoresistance effect element of the present invention, which is composed of the ferromagnetic layers 11 and 13 having predetermined shapes and the fine nano-contact portion 12 disposed between these two ferromagnetic layers 11 and 13.

Figure 7B:
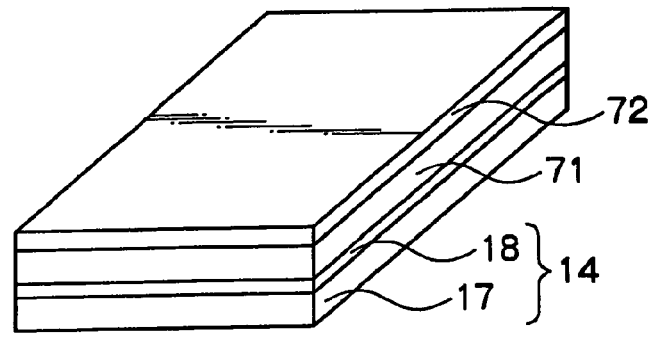
Figure 7C:
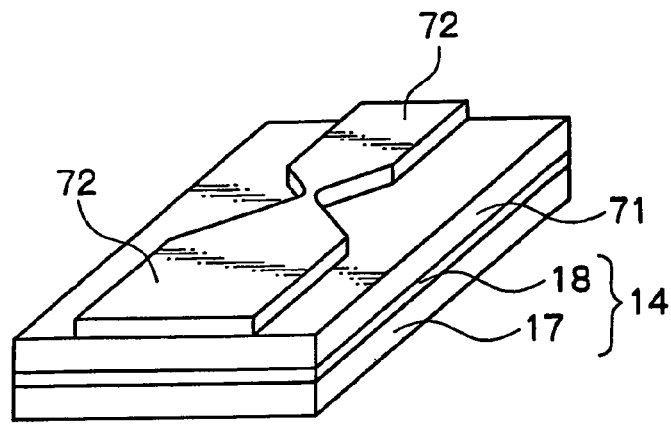
Figure 7D:
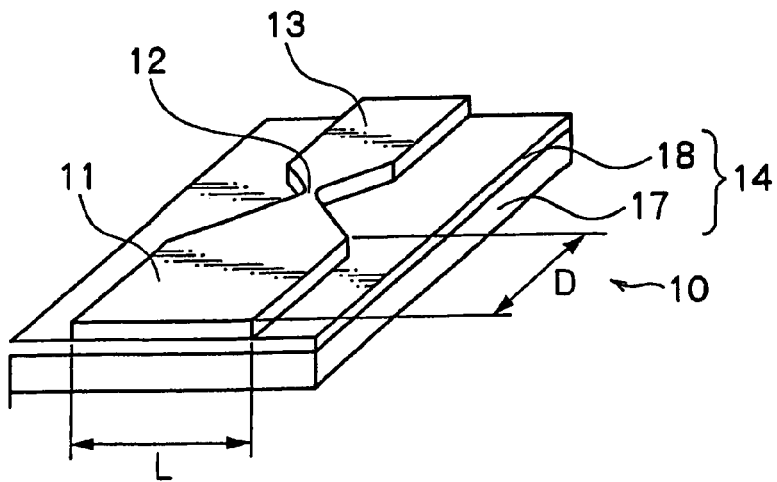

The patterning step will be performed, as shown in FIG. 7B, by first forming a resist film 72 on a layer 71 formed of a ferromagnetic material, irradiating electron beam for patterning the resist film 72 in a predetermined shape to control the pattern in shape of the nano-contact portion 12 and carrying out an ion milling and lift-off process as shown in FIG. 7C, thus manufacturing the magnetoresistance effect element 10 such as shown in FIG. 7D.

Through this patterning process, the nano-contact portion 12 is worked so that it has the maximum length (dimension) of not more than Fermi length of the material constituting the nano-contact portion 12. Further, in FIG. 7D, the lower side ferromagnetic layer 11 denotes the free layer having dimensions L and D which are worked to be most suitable values for a corresponding recording density. Furthermore, this patterning process is carried out so that the first and second contracting angles 01 and 02, such. As shown in FIG. 1, are within a range of 10 to 90° to make the magnetic resistance ratio maximum or almost maximum.

Further, in the magnetoresistance effect element manufacturing method of the present invention, it may be possible to form two or more than two nano-contact portions 12 on the same plane, and for example, as shown in FIG. 8, three nano-contact portions 12 may be formed on the same plane. In the case of the plural nano-contact portions 12, the MR value may be slightly reduced, but the scattering of the MR values in every magnetoresistance effect element can be effectively reduced in comparison with the case of the single nano-contact portion 12, thus easily reproducing the stable MR characteristics.

Furthermore, in the magnetoresistance effect element manufacturing method of the present invention, the permanent magnet layer forming step and the in-stack bias layer forming step for the purpose of limiting the magnetization direction of the first ferromagnetic layer 11 will correspond to those mentioned before with respect to the first ferromagnetic layer 11 with reference to FIGS. 2 to 4, so that the details thereof is omitted here.

In the magnetoresistance effect element manufacturing method of the present invention, also, the permanent magnet layer forming step and the in-stack bias layer forming step for the purpose of limiting the magnetization direction of the second ferromagnetic layer 13 will correspond to those mentioned before with respect to the second ferromagnetic layer 13 with reference to FIGS. 5 and 6, so that the details thereof is omitted here.

Still furthermore, in the magnetoresistance effect element manufacturing method of the present invention, since the nano-contact portion 12 and the first and second ferromagnetic layers 11 and 13 disposed adjacent to the nano-contact portion 12 are formed of the same material, it is possible to carry out the film forming process, the etching process, so that the manufacturing can be itself easily done.

[Magnetic Head]

Figure 10:
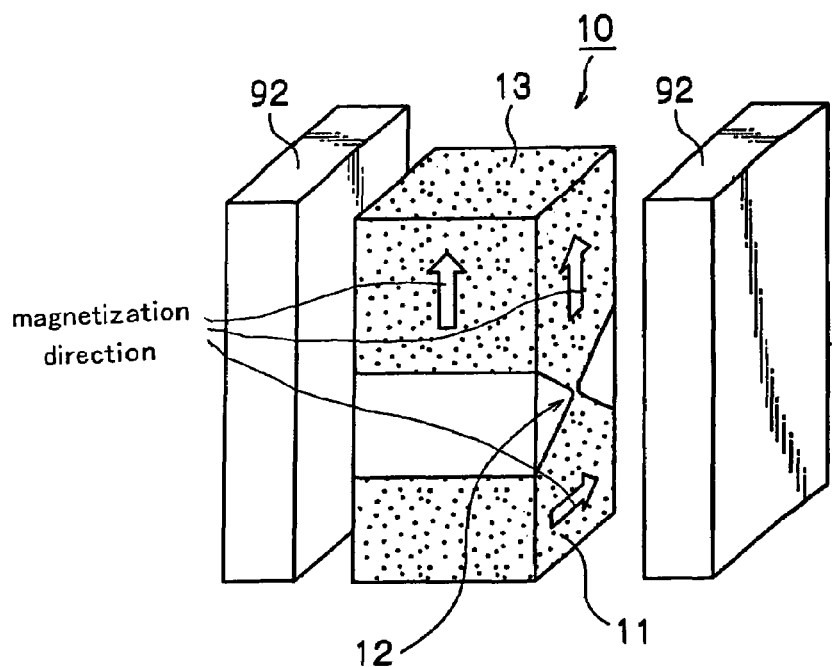
FIG. 10 is an illustrated perspective view of a magnetic head, showing reproducing process thereof, provided with the magnetoresistance effect element of FIG. 1.
Figure 11:
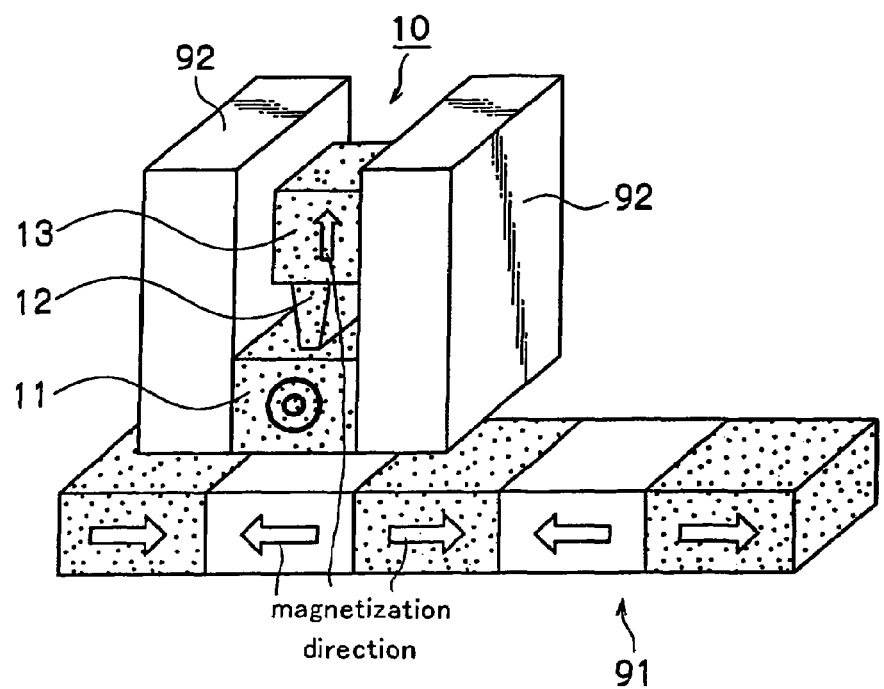
FIG. 11 is an illustrated perspective view of an example of a magnetic head in which a pinned layer and a free layer of the magnetoresistance effect element has difference magnetization directions.

FIGS. 10 and 11 are views showing the case that the magnetoresistance effect element 10 of the present invention is applied to a vertical recording medium reading element, in which FIG. 10 shows one example of magnetized state of the magneto-resistance effect element at a time of reading out the vertical recording medium and FIG. 11 shows a magnetic head, showing reproducing process thereof, provided with the magnetoresistance effect element of FIG. 1.

With reference to FIGS. 10 and 11, the magnetization of the pinned layer positioned at the upper portion as illustrated is directed perpendicularly to a medium 91 by the function of the in-stack bias layer 20 disposed on the second ferromagnetic layer 13 or the permanent magnet layers 32 disposed in adjacent so as to sandwich the second ferromagnetic layer 13 therebetween, and since the pinned layer is apart from the medium 91, the magnetization thereof is less influenced by the magnetic field generated from the magnetization transition area. As a result, a magnetic head provided with such magnetoresistance effect element can ensure the stable reproducing function.

In FIG. 11, reference numeral 92 denotes shield members disposed in a vertical orientation relative to a medium facing surface on both sides of the magnetoresistance effect element 10 of the magnetic head.

Further, with reference to FIGS. 10 and 11, the direction of the easy axis of the free layer positioned at the lower portion as illustrated is parallel to the direction of the medium 91, and the magnetization of the easy axis rotates in sensitive response to the magnetic field generated from the magnetization transition area of the medium. The two ferromagnetic layers 11 and 13 of the magnetoresistance effect element 10 are jointed together by means of external electrode when the element 10 is utilized for the magnetic head.

That is, the magnetic head of the present invention comprises a magnetoresistance effect element such as the element 10 of FIG. 1 comprising the first and second ferromagnetic layers 11 and 13 and the nano-contact portion 12 formed between these ferromagnetic layers 11 and 13 so as to be disposed on the same plane, external electrodes disposed outside the magnetoresistance effect element 10 and a pair of shield members 92 disposed in a vertical orientation relative to a medium facing surface on both sides of the element 10 and the external electrodes.

For example, with reference to FIG. 10 illustrating magnetoresistance effect elements of modes in which the magnetization directions of the first and second ferromagnetic layers as the free and pinned layers are different from each other.

Figure 9A:
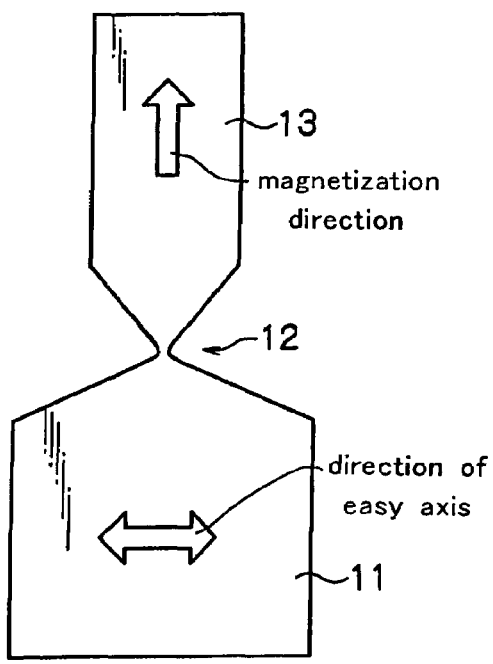
FIGS. 9A and 9B show one example of magnetized state of the magnetoresistance effect element at a time of reading out a vertical recording medium.

FIG. 9A shows a mode in which the easy axis of the first ferromagnetic layer 11 forming the free layer has a magnetization direction parallel to the medium, and on the other hand, normal (perpendicular) to the magnetization direction of the second ferromagnetic layer 13 forming the pinned layer. On the other hand, FIG. 9B is an example showing a mode in which the easy axis of the first ferromagnetic layer 11 forming the free layer has a magnetization direction normal to the medium, and on the other hand, parallel to the magnetization direction of the second ferromagnetic layer 13 forming the pinned layer.

Figure 9B:
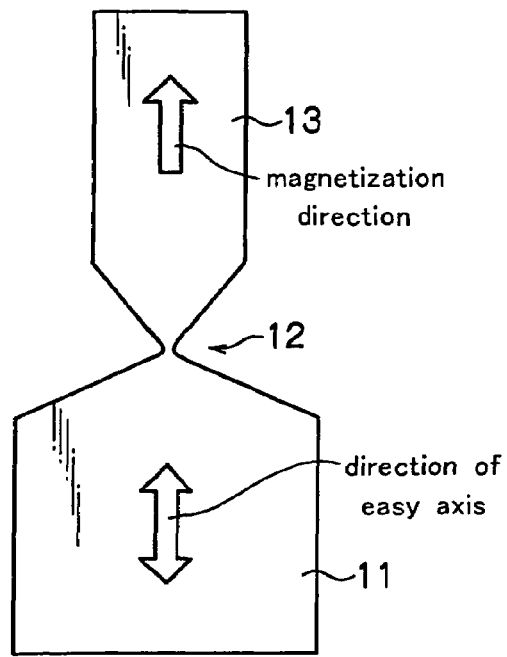

Although the mode represented by FIG. 9A had already been described herein, the mode represented by FIG. 9B has a response not linear to the external field and a switching-like response, which is hence applicable to the MRAM.

Further, FIG. 11 is an illustrated perspective view of an example of a magnetic head in which a pinned layer and a free layer of the magnetoresistance effect element have different magnetization directions.

As mentioned above, according to the magnetoresistance effect element mounted to the magnetic head of the present invention, the easy axis of the free layer arranged in opposition to the recording medium formed of the horizontal magnetic film provides a direction parallel to the magnetization direction of the recording medium, and the magnetization of the easy axis is rotated in sensitive response to the magnetic field generated from the magnetization transition region of the recording medium. As a result, the leak field of the recording medium can be extremely read out. Moreover, the magnetoresistance effect element can indicate the magnetoresistance effect more than 50%, thus providing the magnetic head with reduced sensitivity loss and with improved stability in function.

It is to be noted that the present invention is not limited to the described embodiment and many other changes and modifications may be made without departing from the scopes of the appended claims.

What is claimed is:

1. A magnetoresistance effect element comprising:
a first ferromagnetic layer;
a second ferromagnetic layer; and
at least one nano-contact portion formed between said first and second ferromagnetic layers on a same plane, wherein said nano-contact portion has a maximum dimension of not more than Fermi length of a material constituting the nano-contact portion and the nano-contact portion is made of a same material as that of the first and second ferromagnetic layers, and further wherein said first ferromagnetic layer, said at least one nano-contact portion, and said second ferromagnetic layer are formed as a single layer using a deposition process, further comprising an in-stack bias layer disposed on the first ferromagnetic layer so as to control the magnetization direction of the first ferromagnetic layer,
and wherein the first ferromagnetic layer is formed at a predetermined contracting angle of θ1 towards the nano-contact portion and the second ferromagnetic layer is also formed at a predetermined contracting angle of θ2 towards the nano-contact portion, said contracting angles each being in a range of 10 to 90° selected so as to make maximum or substantially maximum a magnetic resistance change rate of an obtained magnetoresistance effect element, and
wherein said second ferromagnetic layer forms a pinned layer having magnetization which is fixed in a direction apart from the nano-contact portion, and
wherein said in-stack bias layer is composed of a nonmagnetic layer, a ferromagnetic layer and an anti-ferromagnetic layer disposed on the first ferromagnetic layer in this order.

2. A magnetoresistance effect element according to claim 1, wherein said maximum dimension includes a length in a width direction of the nano-contact portion normal to the location of the first and second ferromagnetic layers on the same plane and a length in a direction perpendicular to the width direction.

3. A magnetoresistance effect element according to claim 1, further comprising permanent magnet layers disposed on both side portions of the first ferromagnetic layer so as to control the magnetization direction of the first ferromagnetic layer.

4. A magnetoresistance effect element according to claim 1, further comprising permanent magnet layers disposed on both side portions of the second ferromagnetic layer so as to fix the magnetization direction of the second ferromagnetic layer.

5. A magnetoresistance effect element according to claim 1, further comprising an in-stack bias layer disposed on the second ferromagnetic layer so as to control the magnetization direction of the second ferromagnetic layer.

6. A magnetoresistance effect element according to claim 5, wherein said in-stack bias layer is composed of a nonmagnetic layer, a ferromagnetic layer and an anti-ferromagnetic layer disposed on the second ferromagnetic layer in this order.

7. A magnetoresistance effect element according to claim 1, wherein said first ferromagnetic layer and said second ferromagnetic layer are applied to form a film.

8. A magnetoresistance effect element according to claim 1, wherein said first ferromagnetic layer and said second ferromagnetic layer have a thickness of several nanometers or several tens of nanometers.

9. A magnetoresistance effect element according to claim 1, wherein said same plane is parallel to a base substrate.

10. A method of manufacturing a magnetoresistance effect element comprising the steps of:
preparing a substrate;
forming a first ferromagnetic layer and a second ferromagnetic layer both on the substrate; and
patterning the ferromagnetic layers so as to form a nano contact portion therebetween so that the nano-contact portion has a maximum dimension of not more than Fermi length of a material forming the nano-contact portion, wherein the nano-contact portion is made of a same material as that of the first and second ferromagnetic layers and wherein the nano-contact portion and the first and second ferromagnetic layers are on the same plane, and further wherein said first ferromagnetic layer, said nano contact portion, and said second ferromagnetic layer are formed as a single layer using a deposition process, wherein said second ferromagnetic layer forms a pinned layer having a direction of magnetization which is fixed in a direction apart from the nano-contact portion and further comprising the step of forming an in-stack bias layer on the second ferromagnetic layer, and wherein said in-stack bias layer is composed of a non-magnetic layer, a ferromagnetic layer and an anti-ferromagnetic layer formed on the second ferromagnetic layer in this order.

11. A method of manufacturing a magnetoresistance effect element according to claim 10, wherein said patterning step is performed such that the first ferromagnetic layer is formed at a predetermined contracting angle of θ1 towards the nano-contact portion and the second ferromagnetic layer is also formed at a predetermined contracting angle of θ2 towards the nano-contact portion, said contracting angles each being in a range of 10 to 90° selected so as to make maximum or substantially maximum a magnetic resistance change rate of an obtained magnetoresistance effect element.

12. A method of manufacturing a magnetoresistance effect element according to claim 10, wherein said ferromagnetic layer of the in-stack bias layer is formed of a same material as that of the second ferromagnetic layer.

13. A method of manufacturing a magnetoresistance effect element according to claim 10, wherein said ferromagnetic layer of the in-stack bias layer is formed of a material different from that of the second ferromagnetic layer.

14. A method of manufacturing a magnetoresistance effect element according to claim 10, wherein said first ferromagnetic layer forms a free layer and further comprising the step of forming an in-stack bias layer on the first ferromagnetic layer.

15. A method of manufacturing a magnetoresistance effect element according to claim 14, wherein said in-stack bias layer is composed of a non-magnetic layer, a ferromagnetic layer and an anti-ferromagnetic layer formed on the second ferromagnetic layer in this order.

16. A method of manufacturing a magnetoresistance effect element according to claim 14, wherein said ferromagnetic layer of the in-stack bias layer is formed of a same material as that of the first ferromagnetic layer.

17. A method of manufacturing a magnetoresistance effect element according to claim 14, wherein said ferromagnetic layer of the in-stack bias layer is formed of a material different from that of the first ferromagnetic layer.

18. A method of manufacturing a magnetoresistance effect element according to claim 10, wherein said first ferromagnetic layer and said second ferromagnetic layer are applied to form a film.

19. A method of manufacturing a magnetoresistance effect element according to claim 10, wherein said first ferromagnetic layer and said second ferromagnetic layer have a thickness of several nanometers or several tens of nanometers.

20. A method of manufacturing a magnetoresistance effect element according to claim 10, wherein said same plane is parallel to a base substrate.

21. A magnetic head comprising:
a magnetoresistance effect element;
external electrodes disposed on both sides of the magnetoresistance effect element; and
a pair of shield members disposed on both sides of the external electrodes,
said magnetoresistance effect element comprising: a first ferromagnetic layer; a second ferromagnetic layer; and at least one nano-contact portion formed between said first and second ferromagnetic layers on a same plane, wherein said nano-contact portion has a maximum dimension of not more than Fermi length of a material constituting the nano-contact portion, and the nano-contact portion is made of a same material as that of the first and second ferromagnetic layers, and further wherein said first ferromagnetic layer, said at least one nano-contact portion, and said second ferromagnetic layer are formed as a single layer using a deposition process, further comprising an in-stack bias layer disposed on the first ferromagnetic layer so as to control the magnetization direction of the first ferromagnetic layer, and wherein the first ferromagnetic layer is formed at a predetermined contracting angle of θ1 towards the nano-contact portion and the second ferromagnetic layer is also formed at a predetermined contracting angle of θ2 towards the nano-contact portion, said contracting angles each being in a range of 10 to 90° selected so as to make maximum or substantially maximum a magnetic resistance change rate of an obtained magnetoresistance effect element, and wherein said second ferromagnetic layer forms a pinned layer having magnetization which is fixed in a direction apart from the nano-contact portion, and wherein said in-stack bias layer is composed of a non-magnetic layer, a ferromagnetic layer and an anti-ferromagnetic layer disposed on the first ferromagnetic layer in this order.

22. A magnetic head according to claim 21, wherein said first ferromagnetic layer and said second ferromagnetic layer are applied to form a film.

23. A magnetic head according to claim 21, wherein said first ferromagnetic layer and said second ferromagnetic layer have a thickness of several nanometers or several tens of nanometers.

24. A magnetic head according to claim 21, wherein said same plane is parallel to a base substrate.

25. A magnetoresistance effect element comprising:
a first ferromagnetic layer;
a second ferromagnetic layer; and
at least one nano-contact portion formed between said first and second ferromagnetic layers on a same plane, wherein said nano-contact portion has a maximum dimension of not more than mean free path of a material constituting the nano-contact portion and the nano-contact portion is made of a same material as that of the first and second ferromagnetic layers, and further wherein said first ferromagnetic layer, said at least one nano-contact portion, and said second ferromagnetic layer are formed as a single layer using a deposition process, and further comprising an in-stack bias layer disposed on the first ferromagnetic layer so as to control the magnetization direction of the first ferromagnetic layer, and wherein the first ferromagnetic layer is formed at a predetermined contracting angle of θ1 towards the nano-contact portion and the second ferromagnetic layer is also formed at a predetermined contracting angle of θ2 towards the nano-contact portion, said contracting angles each being in a range of 10 to 90° selected so as to make maximum or substantially maximum a magnetic resistance change rate of an obtained magnetoresistance effect element, and wherein said second ferromagnetic layer forms a pinned layer having magnetization which is fixed in a direction apart from the nano-contact portion, and wherein said in-stack bias layer is composed of a non-magnetic layer, a ferromagnetic layer and an anti-ferromagnetic layer disposed on the first ferromagnetic layer in this order.

26. A magnetoresistance effect element according to claim 25, wherein said maximum dimension includes a length in a width direction of the nano-contact portion normal to the location of the first and second ferromagnetic layers on the same plane and a length in a direction perpendicular to the width direction.

27. A magnetoresistance effect element according to claim 25, further comprising permanent magnet layers disposed on both side portions of the first ferromagnetic layer so as to control the magnetization direction of the first ferromagnetic layer.

28. A magnetoresistance effect element according to claim 25, further comprising permanent magnet layers disposed on both side portions of the second ferromagnetic layer so as to fix the magnetization direction of the second ferromagnetic layer.

29. A magnetoresistance effect element according to claim 25, further comprising an in-stack bias layer disposed on the second ferromagnetic layer so as to control the magnetization direction of the second ferromagnetic layer.

30. A magnetoresistance effect element according to claim 29, wherein said in-stack bias layer is composed of a non-magnetic layer, a ferromagnetic layer and an anti-ferromagnetic layer disposed on the second ferromagnetic layer in this order.

31. A magnetoresistance effect element according to claim 25, wherein said first ferromagnetic layer and said second ferromagnetic layer are applied to form a film.

32. A magnetoresistance effect element according to claim 25, wherein said first ferromagnetic layer and said second ferromagnetic layer have a thickness of several nanometers or several tens of nanometers.

33. A magnetoresistance effect element according to claim 25, wherein said same plane is parallel to a base substrate.

34. A method of manufacturing a magnetoresistance effect element comprising the steps of:
preparing a substrate;
forming a first ferromagnetic layer and a second ferromagnetic layer both on the substrate; and
patterning the ferromagnetic layers so as to form a nano contact portion therebetween so that the nano-contact portion has a maximum dimension of not more than mean free path of a material forming the nano-contact portion, wherein the nano-contact portion is made of a same material as that of the first and second ferromagnetic layers and wherein the nano-contact portion and the first and second ferromagnetic layers are on the same plane, and further wherein said first ferromagnetic layer, said nano-contact portion, and said second ferromagnetic layer are formed as a single layer using a deposition process, and
wherein said second ferromagnetic layer forms a pinned layer having a direction of magnetization which is fixed in a direction apart from the nano-contact portion and further comprising the step of forming an in-stack bias layer on the second ferromagnetic layer, and
wherein said in-stack bias layer is composed of a non-magnetic layer, a ferromagnetic layer and an anti-ferromagnetic layer formed on the second ferromagnetic layer in this order.

35. A method of manufacturing a magnetoresistance effect element according to claim 34, wherein said patterning step is performed such that the first ferromagnetic layer is formed at a predetermined contracting angle of θ1 towards the nano-contact portion and the second ferromagnetic layer is also formed at a predetermined contracting angle of θ2 towards the nano-contact portion, said contracting angles each being in a range of 10 to 90° selected so as to make maximum or substantially maximum a magnetic resistance change rate of an obtained magnetoresistance effect element.

36. A method of manufacturing a magnetoresistance effect element according to claim 34, wherein said ferromagnetic layer of the in-stack bias layer is formed of a same material as that of the second ferromagnetic layer.

37. A method of manufacturing a magnetoresistance effect element according to claim 34, wherein said ferromagnetic layer of the in-stack bias layer is formed of a material different from that of the second ferromagnetic layer.

38. A method of manufacturing a magnetoresistance effect element according to claim 34, wherein said first ferromagnetic layer forms a free layer and further comprising the step of forming an in-stack bias layer on the first ferromagnetic layer.

39. A method of manufacturing a magnetoresistance effect element according to claim 38, wherein said in-stack bias layer is composed of a non-magnetic layer, a ferromagnetic layer and an anti-ferromagnetic layer formed on the second ferromagnetic layer in this order.

40. A method of manufacturing a magnetoresistance effect element according to claim 38, wherein said ferromagnetic layer of the in-stack bias layer is formed of a same material as that of the first ferromagnetic layer.

41. A method of manufacturing a magnetoresistance effect element according to claim 38, wherein said ferromagnetic layer of the in-stack bias layer is formed of a material different from that of the first ferromagnetic layer.

42. A method of manufacturing a magnetoresistance effect element according to claim 34, wherein said first ferromagnetic layer and said second ferromagnetic layer are applied to form a film.

43. A method of manufacturing a magnetoresistance effect element according to claim 34, wherein said first ferromagnetic layer and said second ferromagnetic layer have a thickness of several nanometers or several tens of nanometers.

44. A method of manufacturing a magnetoresistance effect element according to claim 34, wherein said same plane is parallel to a base substrate.

45. A magnetic head comprising:
a magnetoresistance effect element;
external electrodes disposed on both sides of the magnetoresistance effect element; and
a pair of shield members disposed on both sides of the external electrodes,
said magnetoresistance effect element comprising: a first ferromagnetic layer; a second ferromagnetic layer; and at least one nano-contact portion formed between said first and second ferromagnetic layers on a same plane, wherein said nano-contact portion has a maximum dimension of not more than mean free path of a material constituting the nano-contact portion, and the nano-contact portion is made of a same material as that of the first and second ferromagnetic layers, and further wherein said first ferromagnetic layer, said at least one nano-contact portion, and said second ferromagnetic layer are formed as a single layer using a deposition process, and
further comprising an in-stack bias layer disposed on the first ferromagnetic layer so as to control the magnetization direction of the first ferromagnetic layer, and
wherein the first ferromagnetic layer is formed at a predetermined contracting angle of θ1 towards the nano-contact portion and the second ferromagnetic layer is also formed at a predetermined contracting angle of θ2 towards the nano-contact portion, said contracting angles each being in a range of 10 to 90° selected so as to make maximum or substantially maximum a magnetic resistance change rate of an obtained magnetoresistance effect element, and wherein said second ferromagnetic layer forms a pinned layer having magnetization which is fixed in a direction apart from the nano-contact portion, and wherein said in-stack bias layer is composed of a non-magnetic layer, a ferromagnetic layer and an anti-ferromagnetic layer disposed on the first ferromagnetic layer in this order.

46. A magnetic head according to claim 45, wherein said first ferromagnetic layer and said second ferromagnetic layer are applied to form a film.

47. A magnetic head according to claim 45, wherein said first ferromagnetic layer and said second ferromagnetic layer have a thickness of several nanometers or several tens of nanometers.

48. A magnetic head according to claim 45, wherein said same plane is parallel to a base substrate.

* * * * *